United States Patent
Koo et al.

(10) Patent No.: US 8,040,055 B2
(45) Date of Patent: Oct. 18, 2011

(54) ORGANIC LIGHT EMITTING DIODE DISPLAY DEVICE HAVING ORGANIC LAYERS OF VARYING THICKNESS

(75) Inventors: Young-Mo Koo, Yongin (KR); Oh-Keun Song, Yongin (KR); Hye-In Jeong, Yongin (KR); Hyuk-Sang Jun, Yonging (KR); Tae-Shick Kim, Yongin (KR); Seon-Hee Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 240 days.

(21) Appl. No.: 12/427,607

(22) Filed: Apr. 21, 2009

(65) Prior Publication Data

US 2009/0261722 A1   Oct. 22, 2009

(30) Foreign Application Priority Data

Apr. 21, 2008 (KR) .................. 10-2008-0036759

(51) Int. Cl.
*H05B 33/00* (2006.01)
*H05B 33/12* (2006.01)
*H05B 33/24* (2006.01)
(52) U.S. Cl. ........ 313/506; 313/501; 313/504; 428/690; 428/917; 257/40; 257/98
(58) Field of Classification Search ........... 313/504–506
See application file for complete search history.

(56) References Cited

U.S. PATENT DOCUMENTS

| | | | |
|---|---|---|---|
| 5,405,710 A * | 4/1995 | Dodabalapur et al. | 428/690 |
| 5,814,416 A * | 9/1998 | Dodabalapur et al. | 428/690 |
| 2003/0044639 A1 * | 3/2003 | Fukuda | 428/690 |
| 2004/0012330 A1 * | 1/2004 | Ohshita et al. | 313/504 |
| 2005/0040756 A1 | 2/2005 | Winters et al. | |
| 2005/0067954 A1 * | 3/2005 | Nishikawa et al. | 313/506 |
| 2005/0073230 A1 | 4/2005 | Nishikawa et al. | |

(Continued)

FOREIGN PATENT DOCUMENTS

JP        8-213174        8/1996

(Continued)

OTHER PUBLICATIONS

Hsu, Shih-Feng et al., "Highly efficient top-emitting white organic electroluminescent devices", Applied Physics Letters 86, 253508 (2005), 3 pages.

(Continued)

*Primary Examiner* — Sikha Roy
(74) *Attorney, Agent, or Firm* — Christie, Parker & Hale, LLP

(57) ABSTRACT

An organic light emitting diode (OLED) display device for displaying a white color using a first color and a second color that are complementary to each other. The OLED display device includes a substrate, a lower electrode on the substrate in a first direction, a first organic layer on a first region of the lower electrode and having a first EML for displaying a first color, a second organic layer on a second region of the lower electrode and having a second EML for displaying a second color that is complementary to the first color, and an upper electrode disposed on the first and second organic layers in a second direction crossing the first direction, wherein the first organic layer has a different thickness from the second organic layer. In addition, a thin film transistor (TFT) may disposed between the substrate and the lower electrode.

20 Claims, 7 Drawing Sheets

U.S. PATENT DOCUMENTS

| | | |
|---|---|---|
| 2005/0088085 A1 | 4/2005 | Nishikawa et al. |
| 2006/0192220 A1 | 8/2006 | Nishikawa et al. |
| 2007/0228367 A1* | 10/2007 | Nakamura ............ 257/40 |

FOREIGN PATENT DOCUMENTS

| | | |
|---|---|---|
| JP | 8-250786 | 9/1996 |
| JP | 10-177896 | 6/1998 |
| JP | 2004-103532 | 4/2004 |
| JP | 2006-236947 | 9/2006 |
| JP | 2007-520862 | 7/2007 |
| KR | 10-2004-0066721 | 7/2004 |
| KR | 10-2005-0042705 | 5/2005 |
| KR | 10-2005-0095099 | 9/2005 |
| KR | 10-2006-0056378 | 5/2006 |
| KR | 10-2006-0125652 | 12/2006 |
| KR | 10-0712184 | 4/2007 |
| KR | 10-2007-0052914 | 5/2007 |

OTHER PUBLICATIONS

Peng, Huajun et al., "Efficient organic light-emitting diode using semitransparent silver as anode", Applied Physics Letters 87, 173505 (2005), 3 pages.

Peng, H. J. et al., "Efficiency improvement of phosphorescent organic light-emitting diodes using semitransparent Ag as anode", Applied Physics Letters 88, 033509 (2006), 3 pages.

Guo, Tzung-Fang et al., High-brightness top-emissive polymer light-emitting diodes utilizing organic oxide/Al/Ag composite cathode, Applied Physics Letters 89, 051103 (2006), 3 pages.

Lin, Chun-Liang et al., "Influences of resonant wavelengths on performances of microcavity organic light-emitting devices", Applied Physics Letters 90, 071111 (2007), 3 pages.

Korean Notice of Allowance, dated Jun. 24, 2009, for priority Korean application 10-2008-0036759, noting listed references in this IDS.

* cited by examiner

ORGANIC LIGHT EMITTING DIODE DISPLAY DEVICE HAVING ORGANIC LAYERS OF VARYING THICKNESS

CROSS-REFERENCE TO RELATED APPLICATION

This application claims priority to and the benefit of Korean Patent Application No. 10-2008-0036759, filed Apr. 21, 2008, the entire content of which is incorporated herein by reference.

BACKGROUND OF THE INVENTION

1. Field of the Invention

The present invention relates to an organic light emitting diode (OLED) display device, and more particularly, to an OLED display device that displays a white color using complementary first and second colors.

2. Description of the Related Art

A flat panel display device (FPD) has been employed as a display device to replace a cathode-ray tube (CRT) display device because the FPD is lightweight and thin. Typical examples of the FPD are a liquid crystal display (LCD) and an organic light emitting diode (OLED) display device. In comparison with the LCD, the OLED display device has a higher luminance and a wider viewing angle and can be made ultrathin because the OLED display device needs no backlight.

The OLED display device includes an organic layer having at least one organic emission layer (organic EML), which is interposed between an anode and a cathode. Thus, when a voltage is applied between the anode and the cathode, electrons injected through the cathode and holes injected through the anode recombine in the organic EML to produce excitons. As a result, light with a specific wavelength is generated due to the energy of the excitons. The organic layer may further include a hole injection layer (HIL), a hole transport layer (HTL), a hole blocking layer (HBL), an electron transport layer (ETL), and/or an electron injection layer (EIL) to facilitate the injection and/or transport of the electrons and holes.

The OLED display device may be classified into a passive matrix type and an active matrix type depending on how the N×M pixels of the OLED display device that are arranged in a matrix are driven. An active matrix OLED display device includes a circuit using a thin film transistor (TFT). A passive matrix OLED display device can be fabricated using a simple process because anodes and cathodes are arranged in a matrix on a display region. However, the passive matrix OLED display device is applied only to low-resolution small-sized display devices due to its resolution limit, its needs for a high driving voltage, and its short material life span.

By comparison, in the active matrix OLED display device, a TFT is disposed on each pixel of a display region. Thus, a constant amount of current can be supplied to each pixel so that the active matrix OLED display device can emit light with a stable luminance. Also, since the active matrix OLED display device consumes low power, the active matrix OLED display device can be applied to high-resolution large-sized display devices.

In an OLED display device, when light is emitted from an organic layer at or greater than a critical angle, the light emitted from the organic layer is totally reflected at an interface between a layer having a high refractive index and a layer having a low refractive index. Thus, light extraction of the OLED display device is only ¼ light emitted by the organic layer.

In order to solve this problem, the thickness of the organic layer may be varied according to the color of light emitted by the organic layer, or a refractive layer may be formed in a direction in which light emitted by the organic layer is extracted, so that a resonance effect may occur due to an optical micro-cavity to thereby improve the light extraction efficiency of the OLED display device.

However, an organic layer of an OLED display device, for displaying a white color using complementary colors, includes first and second EMLs for displaying first and second colors. Because the first and second EMLs are sequentially stacked, it is difficult to improve the luminous efficiency and luminance of a displayed white color using a resonance effect caused by an optical micro-cavity, and, as such, color coordinates are degraded.

SUMMARY OF THE INVENTION

Aspects of embodiments of the present invention are directed toward an organic light emitting diode (OLED) display device that displays a white color using complementary first and second colors, in which a stack structure of a first emission layer (EML) for displaying the first color and a second EML for displaying the second color is configured to improve the luminous efficiency and luminance of the displayed white color and enhance color coordinates.

According to an embodiment of the present invention, an OLED display device includes: a substrate; a first electrode on the substrate and extending in a first direction; a first organic layer on a first region of the first electrode and having a first emission layer (EML) for displaying a first color; a second organic layer on a second region of the first electrode and having a second EML for displaying a second color that is complementary to the first color; and a second electrode on the first and second organic layers and extending in a second direction crossing the first direction, wherein the first organic layer has a different thickness from the second organic layer.

According to another embodiment of the present invention, an OLED display device includes: a substrate; a thin film transistor (TFT) on the substrate and including a semiconductor layer, a gate insulating layer, a source electrode, a drain electrode, and a gate electrode; a first insulating layer on the TFT and having a via hole partially exposing the source electrode or the drain electrode; a first electrode on the first insulating layer and electrically connected to the source electrode or the drain electrode through the via hole; a first organic layer on a first region of the first electrode and having a first emission layer (EML) for displaying a first color; a second organic layer on a second region of the first electrode and having a second EML for displaying a second color; and a second electrode on the first and second organic layers, wherein the first organic layer has a different thickness from the second organic layer.

According to another embodiment of the present invention, an OLED display device includes: a substrate; a first electrode on the substrate and extending in a first direction; a first organic layer on the first electrode and having a first emission layer (EML) for displaying a first color; a second organic layer on the first electrode and having a second EML for displaying a second color that is complementary to the first color; and a second electrode on the first and second organic layers and extending in a second direction crossing the first direction, wherein the first organic layer has a different thickness from the second organic layer, wherein the first organic layer and the second organic layer are separated from each other along the first direction, and wherein a side of the first organic layer opposing a side of the first electrode is on a same plane as a side of the second organic layer opposing the side of the first electrode.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1A:
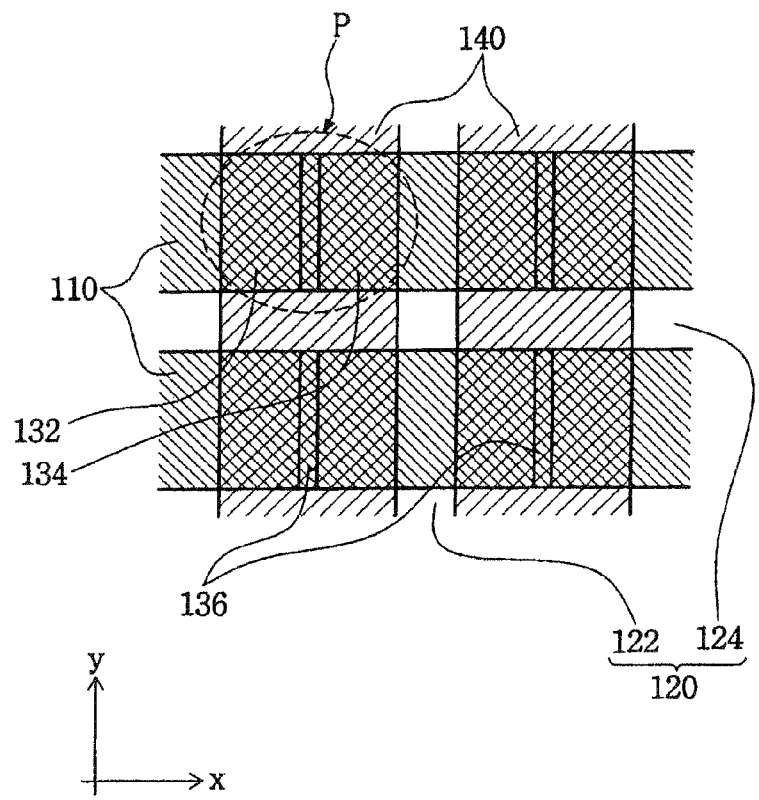
FIG. 1A is a plan schematic view of an organic light emitting diode (OLED) display device according to an exemplary embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Embodiment 1

Figure 1B:
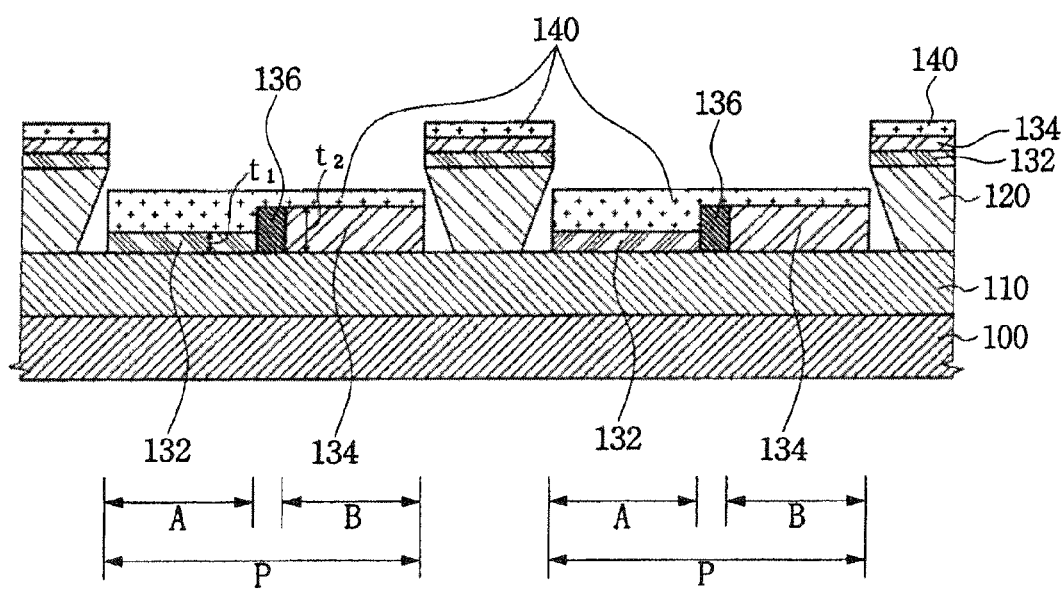
FIG. 1B is a cross-sectional schematic view taken along line I-I' of FIG. 1A.

FIG. 1A is a plan schematic view of an organic light emitting diode (OLED) display device according to an exemplary embodiment of the present invention, and FIG. 1B is a cross-sectional schematic view taken along line I-I' of FIG. 1A.

Referring to FIGS. 1A and 1B, the OLED display device includes a substrate 100 and a lower (or first) electrode 110 disposed on the substrate 100 and disposed (or extending) in a first direction "x". An upper (or second) electrode 140 is disposed (or extending) in a second direction "y" crossing (or orthogonal to) the first direction "x". A separator 120 is interposed between the lower electrode 110 disposed in the first direction "x" and the upper electrode 140 disposed in the second direction "y" and separates a plurality of pixel regions P from one another. A first organic layer 132 is interposed between the lower and upper electrodes 110 and 140 and has a first thickness t1. A second organic layer 134 is interposed between the lower and upper electrodes 110 and 140 and has a second thickness t2. Although the second thickness t2 of the second organic layer 134 is illustrated as being greater than the first thickness t1 of the first organic layer 132 in the present embodiment, the first thickness t1 of the first organic layer 132 may be greater than the second thickness t2 of the second organic layer 134.

The first organic layer 132 may include a first emission layer (EML) for displaying a first color, and the second organic layer 134 may include a second EML for displaying a second color that is complementary in color to the first color.

In addition, each of the first and second organic layers 132 and 134 may include a hole injection layer (HIL), a hole transport layer (HTL), a hole blocking layer (HBL), an electron transport layer (ETL), and/or an electron injection layer (EIL) to facilitate the injection of electrons and/or holes into the first and second EMLs. Alternatively, the first and second organic layers 132 and 134 may include an HIL, an HTL, an HBL, an ETL, and/or an EIL in common.

The HIL may be formed of a low molecular material, such as copper phthalocyanine (CuPc), TNATA, TCTA, TDAPB, and TDATA or a polymer material, such as polyaniline (PANI) and poly(3,4)-ethylenedioxythiophene (PEDOT). The HTL may be formed of a low molecular material, such as N,N'-dinaphthyl-N,N'-diphenyl benzidine (NPD), N,N'-Bis-(3-methylphenyl)-N,N'-bis-(phenyl)-benzidine (TPD), s-TAD, and 4,4',4"-Tris(N-3-methylphenyl-N-phenyl-amino)-triphenylamine (MTDATA) or a polymer material, such as PVK.

Although holes transmitted from the lower electrode 110 or the upper electrode 140 are supposed to recombine with electrons in the first and second EMLs to produce excitons, but because the transmission rate of the holes is higher than that of the electrons, the holes may instead pass through the EMLs and diffuse into the ETL or EIL. In this case, the HBL may be utilized to block (or prevent) the diffusion of the holes into the ETL or EIL and also, to block (or prevent) the diffusion of produced excitons. The HBL may be formed of Balq, BCP, CF-X, TAZ, and/or spiro-TAZ.

The ETL may be formed of a polymer material, such as PBD, TAZ, and spiro-PBD, or a monomer material, such as Alq3, BAlq, and SAlq. The EIL may be formed of tris(8-hydroxyquinolinato) aluminum (Alq3), lithium fluoride (LiF), Ga complex, and/or PBD. Each of the HIL, HTL, ETL, EIL, and HBL may be formed using a vacuum evaporation method, a spin coating method, an inkjet printing method, and/or a laser induced thermal imaging (LITI) method.

Each of the pixel regions P is disposed in a region where the lower electrode 110 crosses (or intersects) the upper electrode 140 and may include an insulating layer 136 interposed between the first and second organic layers 132 and 134 in order to block (or prevent) color displayed by mixing light emitted by the first EML of the first organic layer 132 and the second EML of the second organic layer 134 from becoming turbid.

FIGS. 2A through 2D are cross-sectional schematic views illustrating a method of fabricating an OLED display device according to an exemplary embodiment of the present invention.

Hereinafter, a method of fabricating an OLED display device according to the present embodiment will be described with reference to FIGS. 1A and 2A through 2D.

Figure 2A:
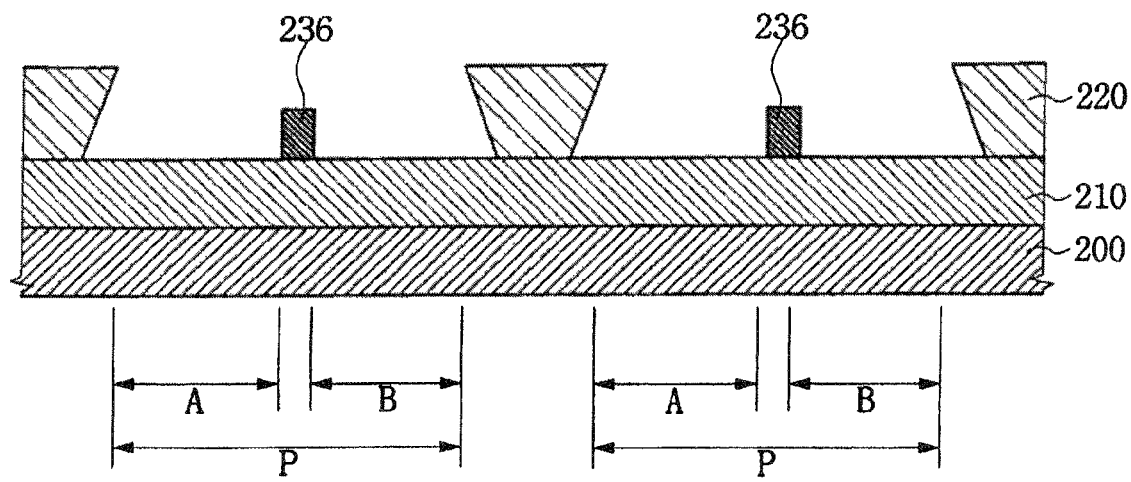
FIGS. 2A through 2D are cross-sectional schematic views illustrating a method of fabricating the OLED display device shown in FIG. 1A.

Referring to FIG. 2A, a lower electrode 210 is formed on a substrate 200 in a first direction. The substrate 200 may be formed of glass, a synthetic resin, and/or stainless steel. The lower electrode 210 may be formed of a transparent conductive material having a relatively large work function, such as indium tin oxide (ITO) or indium zinc oxide (IZO), or a material having a relatively small work function, such as Al, Ag, or an alloy thereof. When the lower electrode 210 is an anode, the lower electrode 210 may be formed of ITO or IZO.

When the lower electrode 210 is a cathode, the lower electrode 210 may be formed of Al, Ag, or an alloy thereof.

Thereafter, a latticed separator 220 is formed on the lower electrode 210, thereby separating a plurality of pixel regions P from one another. As illustrated in FIG. 1A, the separator 220 includes a first separator 122 disposed in the first direction like the lower electrode 210 and a second separator 124 disposed in a second direction crossing (or orthogonal) to the first direction.

After that, an insulating layer 236 is formed between a first region A and a second region B of each of the pixel regions P, where a first organic layer 232 and a second organic layer 234 will be formed in a subsequent process, in order to block (or prevent) color displayed by mixing light emitted by a first EML of the first organic layer 232 and a second EML of the second organic layer 234 from becoming turbid.

Figure 2B:
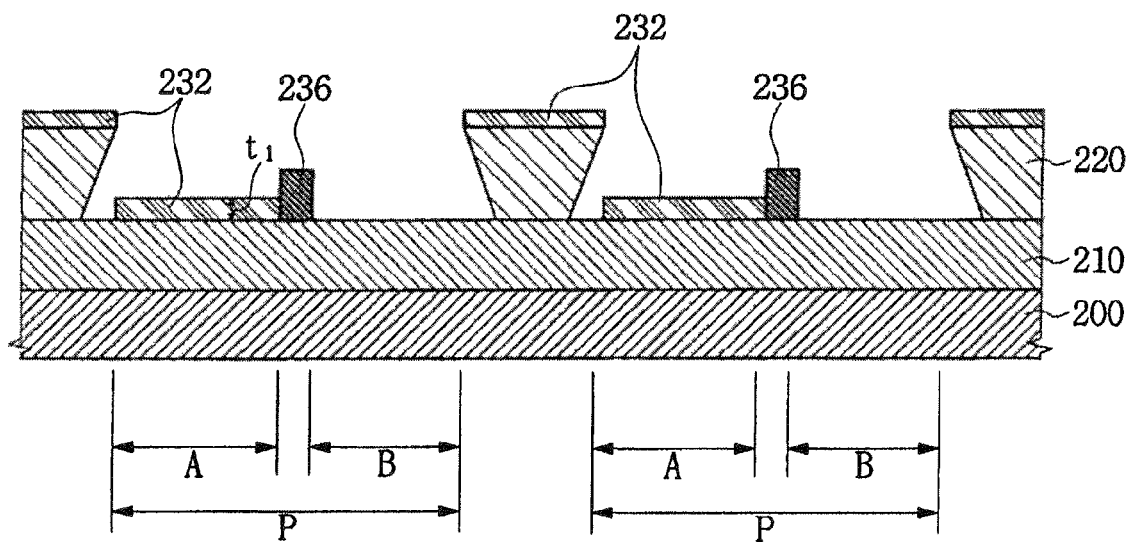

Referring to FIG. 2B, the first organic layer 232 having the first EML for displaying a first color is formed to a first thickness t1 on the separator 220 and the first region A of each of the pixel regions P separated by the separator 220. The first thickness t1 of the first organic layer 232 is determined by light emitted by the first EML such that the first EML may produce a resonance effect due to optical micro-cavity.

Figure 2C:
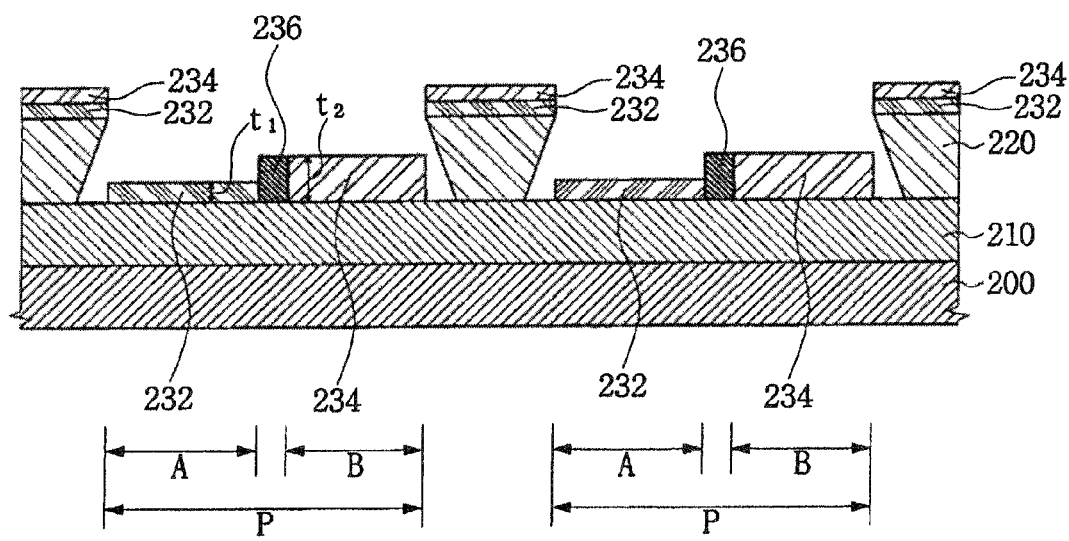

Referring to FIG. 2C, a second organic layer 234 having a second EML for displaying a second color is formed to a second thickness t2 on the second region B of the pixel region P and the separator 220. The second color is complementary in color to the first color. The second thickness t2 of the second organic layer 234 is determined by light emitted by the second EML such that the second EML may cause a resonance effect due to optical micro-cavity. Thus, the first thickness t1 of the first organic layer 232 for displaying the first color is different from the second thickness t2 of the second organic layer 234 for displaying the second color that is complementary to the first color.

Each of the first and second organic layers 232 and 234 may be obtained by forming an HIL, an HTL, an HBL, an ETL, and/or an EIL to facilitate the injection and/or transport of the electrons and holes. Alternatively, the first and second organic layers 232 and 234 may be formed at the same time by forming an HIL, an HTL, an HBL, an ETL, and/or an EIL in common.

Also, the first thickness t1 of the first organic layer 232 may be made different from the second thickness t2 of the second organic layer 234 using a difference in thickness between the first and second EMLs. Alternatively, the first thickness t1 of the first organic layer 232 may be made different from the second thickness t2 of the second organic layer 234 by varying the thickness of the HIL, HTL, HBL, ETL, and/or EIL formed in common in the first and second organic layers 232 and 234.

Figure 2D:
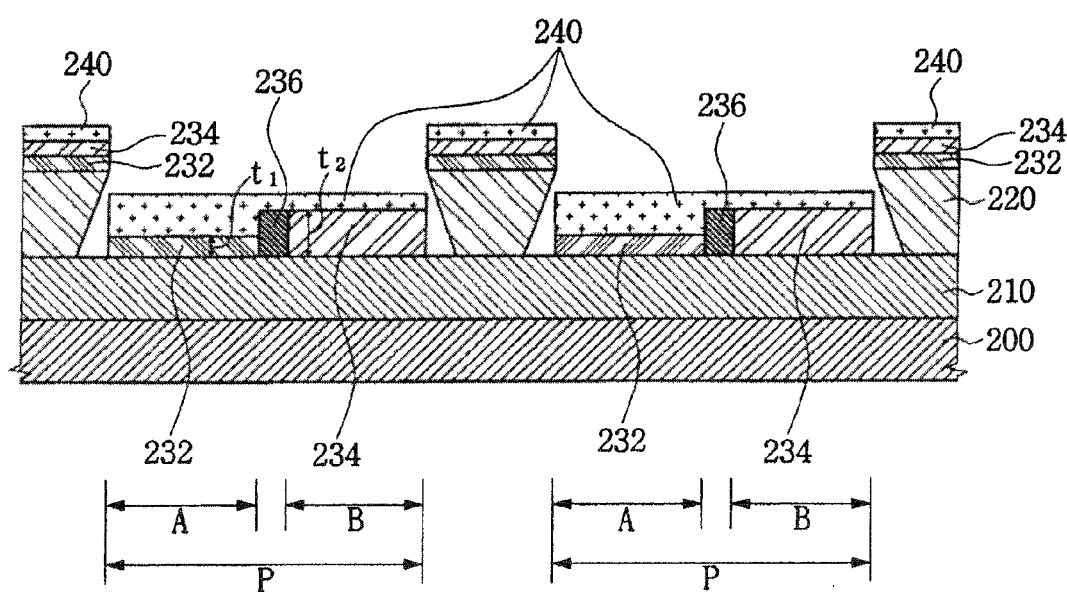

Referring to FIG. 2D, an upper electrode 240 is formed on the first and second organic layers 232 and 234 in the second direction crossing (or orthogonal) to the first direction. Like the lower electrode 210, the upper electrode 240 may be formed of a transparent conductive material having a relatively large work function, such as ITO or IZO, or a material having a relatively small work function, such as Al, Ag, or an alloy thereof. In order to facilitate the injection of electrons and holes into the first and second organic layers 232 and 234, the upper electrode 240 may be formed of a material having a work function that differs greatly from that of the lower electrode 210. When the lower electrode 210 is an anode, the upper electrode 240 may be a cathode formed of Al, Ag, or an alloy thereof. When the lower electrode 210 is a cathode, the upper electrode 240 may be an anode formed of ITO or IZO.

Also, in order to further improve a resonance effect caused by optical micro-cavity of light emitted by the first and second EMLs of the first and second organic layers 232 and 234, a refractive layer may be further formed under the lower electrode 210 or on the upper electrode 240 in a direction in which light emitted by the first and second EMLs is extracted.

When the refractive layer is formed under the lower electrode 210, the refractive layer may be interposed between the lower electrode 210 and the substrate 200 and obtained by stacking a first refractive layer having a relatively high refractive index and a second refractive layer having a relatively low refractive index. The refractive layer may be formed to a different thickness in the first region A where the first organic layer 232 is formed from in the second region B where the second organic layer 234 is formed. In order to increase a resonance effect caused by optical micro-cavity, one of the first and second refractive layers may have a higher refractive index than the lower electrode 210, and the other may have a lower refractive index than the lower electrode 210.

The refractive layer may be formed of nano porous silica, siloxane, $MgF_2$, $CaF_2$, Teflon, silica aerogel, $SiO_2$, $SiN_x$, $TiO_2$, $HfO_2$, $Nb_2O_5$, $Ta_2O_5$, $Sb_2O_3$, a synthetic polymer, and/or benzo-cyclo-butene (BCB).

Table 1 shows the efficiency of the OLED display device according to the present embodiment compared with that of a conventional OLED display device that displays a white color using first and second complementary colors.

TABLE 1

| Division | Efficiency (%) |
| --- | --- |
| Conventional OLED display device | 100 |
| OLED display device of the present embodiment | 146 |

Normally, a resonance effect caused by optical micro-cavity refers to an optical mechanism in which light traveling in an opposite direction to a light extraction direction is reflected toward the light extraction direction and simultaneously, light reflected in the opposite direction to the light extraction direction is made to interfere with light traveling in the light extraction direction so as to improve the light extraction efficiency and luminance of light traveling in the light extraction direction.

Accordingly, as shown in Table 1, as compared with the conventional OLED display device in which first and second EMLs for displaying first and second colors are sequentially stacked to display a white color, the OLED display device according to the present embodiment has relatively high efficiency because the first organic layer 232 having the first EML and the second organic layer 234 having the second EML are disposed laterally from each other (or in a horizontal direction) and the thicknesses t1 and t2 of the first and second organic layers 232 and 234 are controlled using the first and second EMLs such that the first and second colors displayed by the first and second organic layers 232 and 234 provoke a resonance due to optical micro-cavity.

As a consequence, in the OLED display device according to the current embodiment, the first organic layer having the first EML for displaying the first color and the second organic layer having the second EML for displaying the second color that is complementary to the first color are disposed laterally from each other (or in the horizontal direction), and the first and second organic layers are formed to different thicknesses, so that the first and second colors emitted by the first and second organic layers produce a resonance effect due to optical micro-cavity.

Embodiment 2

Figure 3:
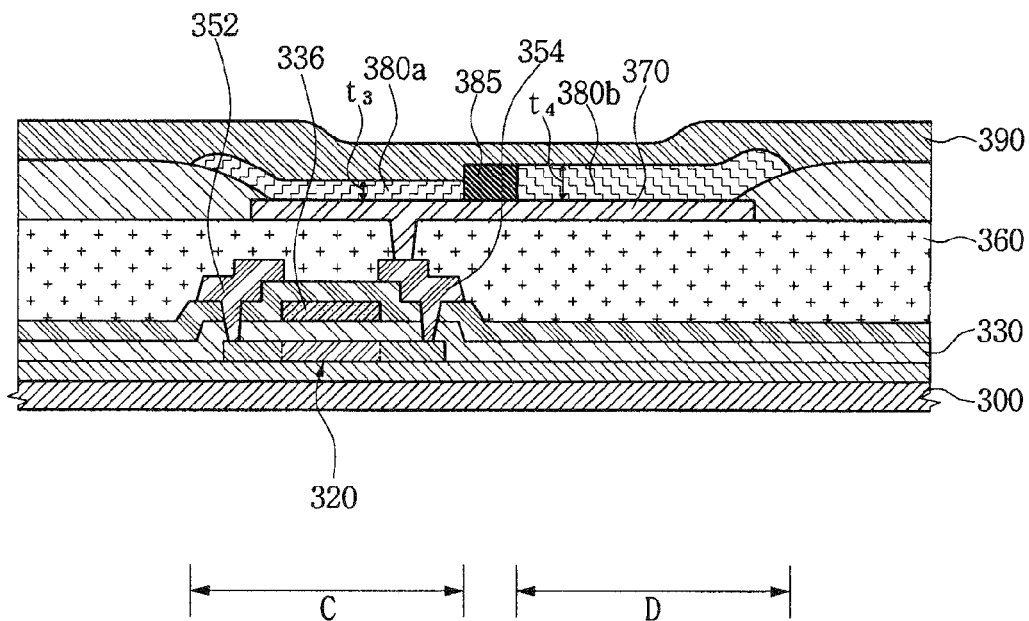
FIG. 3 is a cross-sectional schematic view of an OLED display device according to another exemplary embodiment of the present invention.

FIG. 3 is cross-sectional schematic view according to another exemplary embodiment of the present invention.

Referring to FIG. 3, the OLED display device includes a substrate 300 and a thin film transistor (TFT) disposed on the substrate 300. The TFT includes a semiconductor layer 320, a gate insulating layer 330, a source electrode 352, a drain electrode 354, and a gate electrode 336. A first insulating layer 360 is disposed on the TFT. A lower (or first) electrode 370 is disposed on the first insulating layer 360. A first organic layer 380a is disposed on a first region C of the lower electrode 370 and has a first thickness t3. A second organic layer 380b is disposed on a second region D of the lower electrode 370 and has a second thickness t4 different from the first thickness t3. An upper (or second) electrode 390 is disposed on the resultant structure having the second organic layer 380b. Although the second thickness t4 of the second organic layer 480a is illustrated as being greater than the first thickness t3 of the first organic layer 380a in the present embodiment, the first thickness t3 of the first organic layer 380a may be greater than the second thickness t4 of the second organic layer 480a.

The first organic layer 380a includes a first EML for displaying a first color, and the second organic layer 380b includes a second EML for displaying a second color. In this case, a second insulating layer 385 may be further disposed between the first and second organic layers 380a and 380b in order to block (or prevent) color displayed by mixing light emitted by the first EML of the first organic layer 380a and the second EML of the second organic layer 380b from becoming turbid.

In addition, each of the first and second organic layers 380a and 380b may include an HIL, an HTL, an HBL, an ETL, and/or an EIL to facilitate the injection or transport of the electrons and holes. Alternatively, the first and second organic layers 380a and 380b may include an HIL, an HTL, an HBL, an ETL, and/or an EIL in common.

FIGS. 4A through 4E are cross-sectional schematic views illustrating a method of fabricating an OLED display device according to another exemplary embodiment of the present invention.

Hereinafter, a method of fabricating an OLED display device according to the present embodiment will be described with FIGS. 4A through 4E.

Figure 4A:
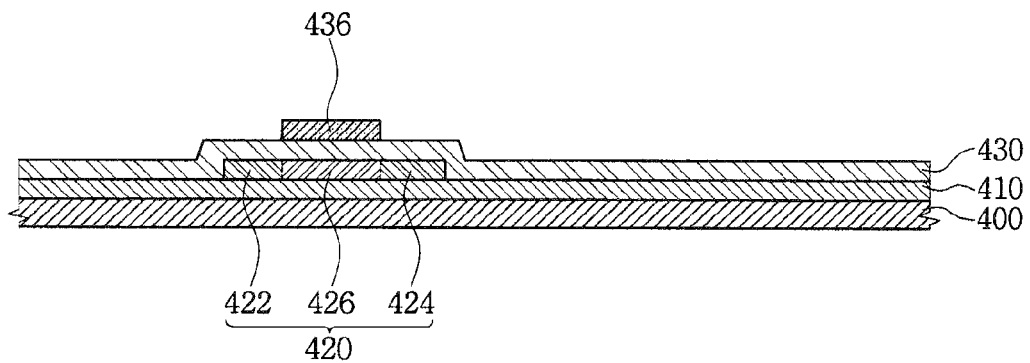
FIGS. 4A through 4E are cross-sectional schematic views illustrating a method of fabricating the OLED display device shown in FIG. 3.

Referring to FIG. 4A, a buffer layer 410 is formed on a substrate 400 formed of glass, a synthetic resin, or stainless steel. The buffer layer 410 may be formed of a silicon oxide ($SiO_2$) layer, a silicon nitride ($SiN_x$) layer, or a combination thereof. The buffer layer 410 functions to block (or prevent) the diffusion of impurities in the substrate 400. In one embodiment, the buffer layer 410 may be omitted.

Thereafter, an amorphous silicon (a-Si) layer may be formed on the buffer layer 410 and crystallized into a polycrystalline silicon (poly-Si) layer. The poly-Si layer is patterned to form a semiconductor layer 420. Although the semiconductor layer 420 is formed by crystallizing the a-Si layer into the poly-Si layer in the present embodiment, the semiconductor layer 420 may be formed of an a-Si layer.

A gate insulating layer 430 is formed on the substrate 400 having the semiconductor layer 420. The gate insulating layer 430 is formed of a silicon oxide ($SiO_2$) layer, a silicon nitride ($SiN_x$) layer, or a combination thereof. A metal layer for a gate electrode is formed on the gate insulating layer 430. The metal layer may be a single layer or a multiple layer formed of aluminum (Al), chrome (Cr), molybdenum (Mo), or an alloy thereof.

The metal layer for the gate electrode is then etched through photolithography and etching processes, thereby forming a gate electrode 436 corresponding to a region (or predetermined region) of the semiconductor layer 420. Conductive impurities are doped into the semiconductor layer 420 using the gate electrode 436 as a mask, thereby forming a source region 422, a drain region 424, and a channel region 426 in the semiconductor layer 420. The channel region 426 is the region of the semiconductor layer 420 corresponding to the gate electrode 436. The channel region 426 is not doped with the conductive impurities due to the gate electrode 436. Although the conductive impurities are doped into the semiconductor layer 420 using the gate electrode 436 as the mask in the present embodiment, the impurity doping process may be performed on the semiconductor layer 420 using photoresist before the gate electrode 436 is formed.

Figure 4B:
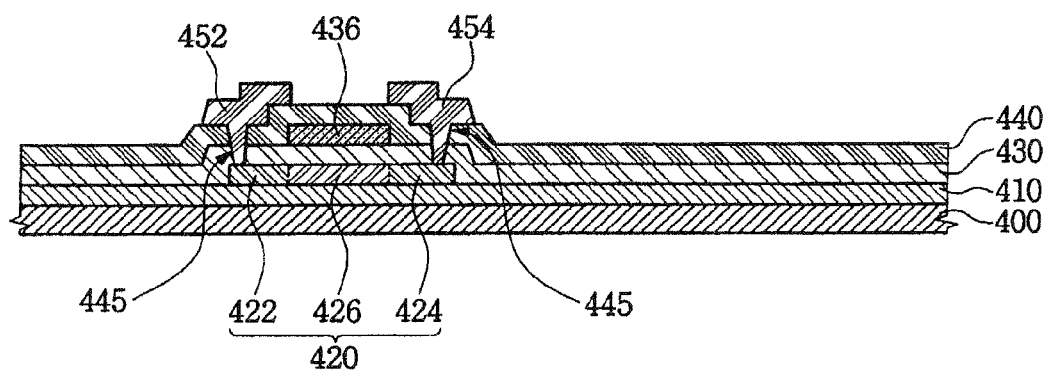

Referring to FIG. 4B, an interlayer insulating layer 440 is formed on the substrate 400 having the gate electrode 436, and the interlayer insulating layer 440 and the gate insulating layer 430 are etched, thereby forming contact holes 445 to expose the source and drain regions 422 and 424. The interlayer insulating layer 440 may be formed of a silicon oxide ($SiO_2$) layer, a silicon nitride ($SiN_x$) layer, or a combination thereof.

A conductive material layer is formed on the interlayer insulating layer 440 having the contact holes 445 and patterned, thereby forming a source electrode 452 and a drain electrode 454 to be electrically connected to the source and drain regions 422 and 424 through the contact holes 445, respectively. As a result, a TFT is formed. The conductive material layer may be formed of a material having a high electron mobility, such as moly-tungsten (MoW), aluminum (Al), or an Al alloy, such as aluminum-neodymium (Al—Nd).

Although it is described in the present embodiment that the gate electrode 436 of the TFT is formed on the semiconductor layer 420, the gate electrode 436 of the TFT may be formed under the semiconductor layer 420. Also, a portion of the conductive material layer may be used to form a metal interconnection line, such as a data line, a scan line, or a power supply voltage supply line, between adjacent main pixel regions.

Figure 4C:
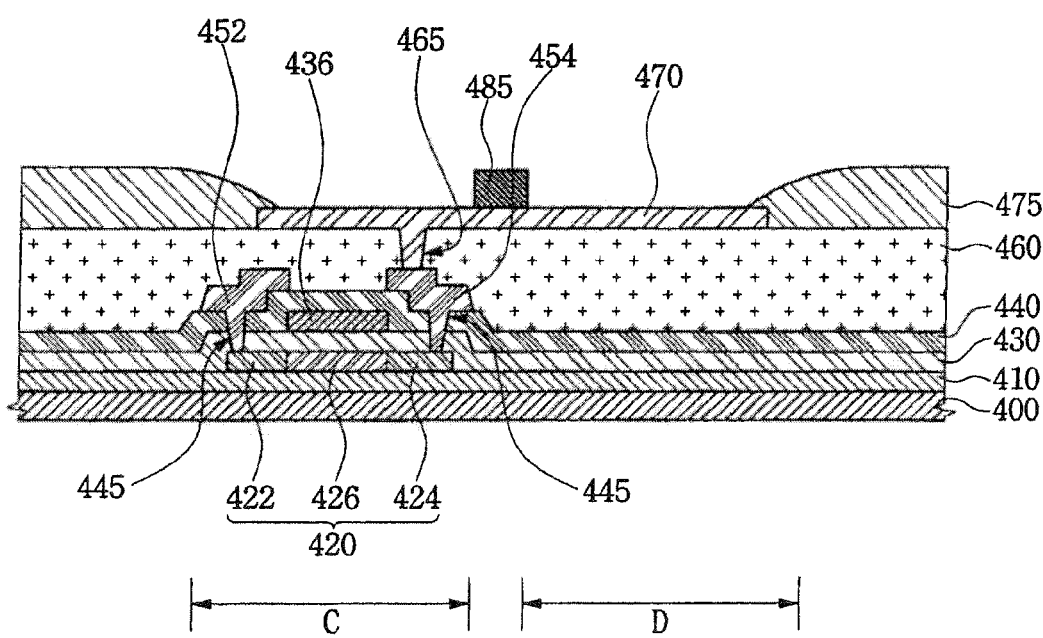

Referring to FIG. 4C, a first insulating layer 460 is formed on the substrate 400 having the TFT and etched, thereby forming a via hole 465 to partially expose the drain electrode 454 of the TFT. Although it is described in the present embodiment that the drain electrode 454 of the TFT is partially exposed by the via hole 465, the via hole 465 may be formed to partially expose the source electrode 452 of the TFT.

The first insulating layer 460 may be an inorganic layer formed of a silicon oxide ($SiO_2$) layer, a silicon nitride ($SiN_x$) layer, or a combination thereof, an organic layer formed of acryl, or a combination of the organic and inorganic layers. For example, the formation of the first insulating layer 460 may include forming an inorganic layer on the TFT using a silicon oxide ($SiO_2$) layer, a silicon nitride ($SiN_x$) layer, or a combination thereof and forming an organic layer using acryl such that a lower portion of a lower electrode 470 that will be formed on the first insulating layer 460 in a subsequent process is flattened.

Thereafter, a conductive material layer is formed on the first insulating layer 460 and patterned, thereby forming the lower electrode 470 to be electrically connected to the drain electrode 454 of the TFT through the via hole 465. The lower electrode 470 may be formed of a conductive transparent material having a large work function, such as ITO or IZO. In order to improve luminous efficiency, a reflective layer pattern may be further formed of aluminum (Al), silver (Ag), or an alloy thereof under the lower electrode 470.

A material layer for a pixel defining layer is deposited on the lower electrode 470 and etched, thereby forming a pixel defining layer 475 having an opening to partially expose the lower electrode 470. The material layer for the pixel defining layer 475 may be formed of polyimide, BCB, a phenol resin, and/or acrylate.

In order to block (or prevent) color displayed by mixing light emitted by first and second EMLs of first and second organic layers 480a and 480b that will be formed in a subsequent process from being turbid, a second insulating layer 485 is formed between a first region C and a second region D where the first and second organic layers 480a and 480b will be formed in the subsequent process.

Figure 4D:
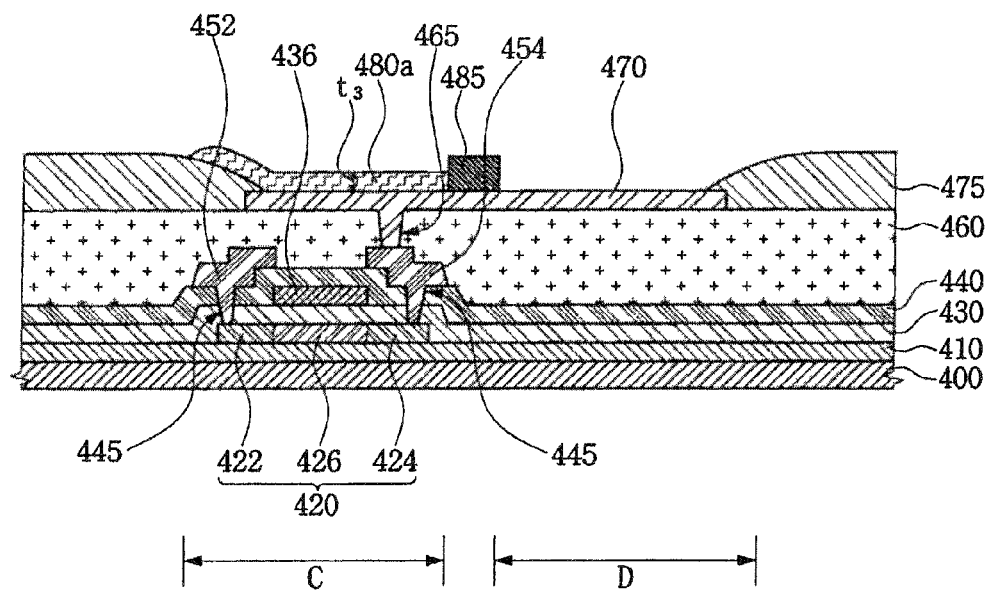

Referring to FIG. 4D, the first organic layer 480a having a first EML for displaying a first color is formed to a first thickness t3 in the first region C of the lower electrode 470 exposed by the opening of the pixel defining layer 475. The first organic layer 480a may include a red (R) EML, a green (G) EML, and/or a blue (B) EML. In addition to the first EML, the first organic layer 480a may further include an HIL, an HTL, an HBL, an ETL, and/or an EIL.

Figure 4E:
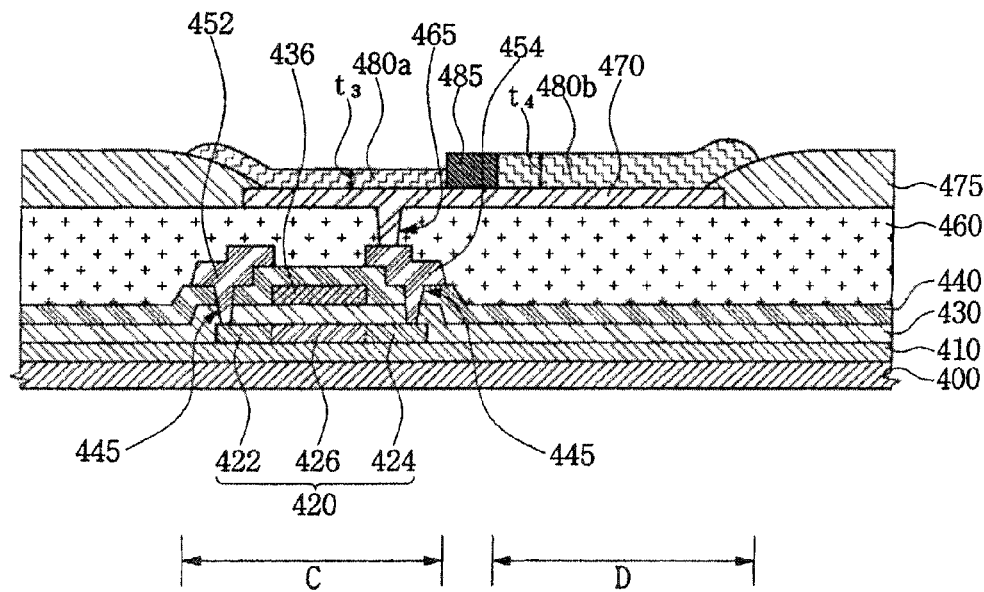

Referring to FIG. 4E, the second organic layer 480b having a second EML for displaying a second color is formed to a second thickness t4 in the second region D of the lower electrode 470 exposed by the opening of the pixel defining layer 475. The second color is complementary in color to the first color. The second organic layer 480b may include at least one of an R EML, a G EML, and/or a B EML, which is not included in (or not displayed by) the first EML. In addition to the second EML, the second organic layer 480b may further include an HIL, an HTL, an HBL, an ETL, and/or an EIL.

The first and second organic layers 480a and 480b may also include the HIL, HTL, HBL, ETL, and/or EIL in common. The HIL, HTL, HBL, ETL, and/or EIL included in common in the first and second organic layers 480a and 480b may have a different thickness in the first organic layer 480a than that in the second organic layer 480b.

Subsequently, an upper electrode is formed on the first and second organic layers 480a and 480b, thereby completing the fabrication of the OLED display device according to the present embodiment.

According to the present embodiment, a refractive layer may be further formed under the lower electrode 470 or on the upper electrode in order to further enhance the resonance effect caused by optical micro-cavity of light emitted by the first and second EMLs of the first and second organic layers 480a and 480b. The refractive layer may be formed in a direction in which the light emitted by the first and second EMLs is extracted.

When the refractive layer is formed under the lower electrode 470, the refractive layer may be interposed between the lower electrode 470 and the substrate 400 and obtained by stacking a first refractive layer having a relatively high refractive index and a second refractive layer having a relatively low refractive index. The refractive layer may be formed to have a different thickness in the first region C where the first organic layer 480a is formed than that in the second region D where the second organic layer 480b is formed. In order to increase a resonance effect caused by optical micro-cavity, one of the first and second refractive layers may have a higher refractive index than the lower electrode 470, and the other may have a lower refractive index than the lower electrode 470.

The refractive layer may be formed of nano porous silica, siloxane, $MgF_2$, $CaF_2$, Teflon, silica aerogel, $SiO_2$, $SiN_x$, $TiO_2$, $HfO_2$, $Nb_2O_5$, $Ta_2O_5$, $Sb_2O_3$, a synthetic polymer, and/or BCB.

As a result, in the OLED display device according to the current embodiment, the first organic layer having the first EML for displaying the first color and the second organic layer having the second EML for displaying the second color that is complementary to the first color are disposed laterally from each other (or in the horizontal direction) on the lower electrode that is electrically connected to the source electrode or the drain electrode of the TFT. Also, the first and second organic layers are formed to different thicknesses. Thus, light emitted by the first EML produces a resonance effect caused by optical micro-cavity in the first region where the first organic layer is formed, while light emitted by the second EML produces a resonance effect caused by optical micro-cavity in the second region where the second organic layer is formed.

Embodiment 3

Figure 5:
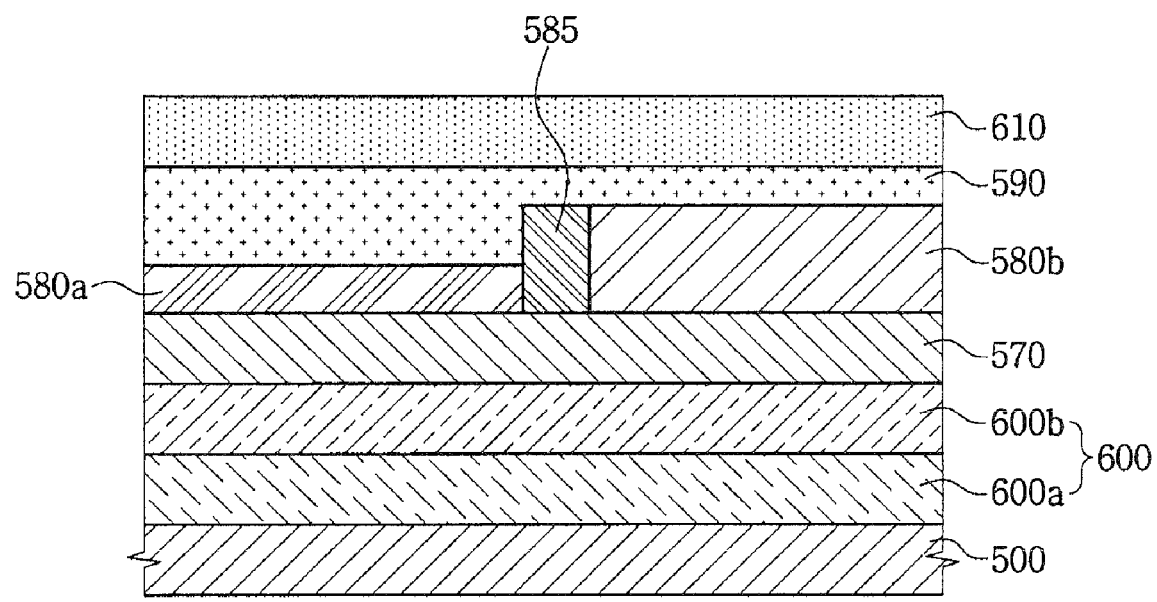
FIG. 5 is a cross-sectional schematic view of an OLED display device according to another exemplary embodiment of the present invention.

FIG. 5 is a cross-sectional schematic view of an OLED display device according to another exemplary embodiment of the present invention.

Referring to FIG. 5, the OLED display device includes a substrate 500. A lower (or first) electrode 570 is disposed on the substrate 500. A thin film transistor (TFT) may be also disposed on the substrate 500 and/or between the lower electrode 570 and the substrate 500. A first organic layer 580a is disposed on a first region of the lower electrode 570 and has a first thickness. A second organic layer 580b is disposed on a second region of the lower electrode 570 and has a second thickness different from the first thickness. An upper (or second) electrode 590 is disposed on the resultant structure having the second organic layer 580b. Here, as shown, the first organic layer 580a and the second organic layer 580b are laterally separated from each other by an insulating layer 585, and a side of the first organic layer 580a facing a side of the lower electrode 570 is on a same plane as a side of the second organic layer 580b facing the same side of the lower electrode 570.

In addition, as shown in FIG. 5, a refractive layer 600, 610 is further formed under the lower electrode 570 or on the upper electrode 590. When the refractive layer 600 is formed under the lower electrode 570, the refractive layer may be interposed between the lower electrode 570 and the substrate 500 and obtained by stacking a first refractive layer 600a having a relatively high refractive index and a second refractive layer 600b having a relatively low refractive index. The refractive layer 600 may be formed to have a different thickness in the first region where the first organic layer 580a is formed than that in the second region where the second organic layer 580b is formed. In order to increase a resonance effect caused by optical micro-cavity, one of the first and second refractive layers 600a, 600b may have a higher refractive index than the lower electrode 570, and the other may have a lower refractive index than the lower electrode 570.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode (OLED) display device comprising:
   a substrate;
   a first electrode on the substrate and extending in a first direction;
   a first organic layer on a first region of the first electrode and having a first emission layer (EML) for displaying a first color;
   a second organic layer on a second region of the same first electrode and having a second EML for displaying a second color that is complementary to the first color; and
   a second electrode on the first and second organic layers and extending in a second direction crossing the first direction,
   wherein the first organic layer has a different thickness from the second organic layer.

2. The OLED display device according to claim 1, further comprising a refractive layer between the first electrode and the substrate or on a side of the second electrode facing away from the first and second organic layers.

3. The OLED display device according to claim 2, wherein the refractive layer has a different thickness in the first region than in the second region.

4. The OLED display device according to claim 2, wherein the refractive layer includes a first refractive layer and a second refractive layer having different refractive indices.

5. The OLED display device according to claim 4, wherein one of the first and second refractive layers has a higher refractive index than that of the first electrode, and the other of the first and second refractive layers has a lower refractive index than that of the first electrode.

6. The OLED display device according to claim 1, wherein the first EML or the second EML comprises at least one color EML selected from the group consisting of a red EML, a green EML, and a blue EML.

7. The OLED display device according to claim 1, further comprising an insulating layer between the first and second organic layers.

8. The OLED display device according to claim 1, wherein the first and second organic layers comprises at least one layer in common selected from the group consisting of a hole injection layer (HIL), a hole transport layer (HTL), a hole blocking layer (HBL), an electron transport layer (ETL), and an electron injection layer (EIL).

9. The OLED display device according to claim 8, wherein the at least one layer in common in the first and second organic layers has a different thickness in the first organic layer than in the second organic layer.

10. An organic light emitting diode (OLED) display device comprising:
    a substrate;
    a thin film transistor (TFT) on the substrate and including a semiconductor layer, a gate insulating layer, a source electrode, a drain electrode, and a gate electrode;
    a first insulating layer on the TFT and having a via hole partially exposing the source electrode or the drain electrode;
    a first electrode on the first insulating layer and electrically connected to the source electrode or the drain electrode through the via hole;
    a first organic layer on a first region of the first electrode and having a first emission layer (EML) for displaying a first color;
    a second organic layer on a second region of the same first electrode and having a second EML for displaying a second color; and
    a second electrode on the first and second organic layers, wherein the first organic layer has a different thickness from the second organic layer.

11. The OLED display device according to claim 10, further comprising a refractive layer between the first electrode and the substrate or on a side of the second electrode facing away from the first and second organic layers.

12. The OLED display device according to claim 11, wherein the refractive layer has a different thickness in the first region than in the second region.

13. The OLED display device according to claim 11, wherein the refractive layer has a first refractive layer and a second refractive layer having different refractive indices.

14. The OLED display device according to claim 13, wherein one of the first and second refractive layers has a higher refractive index than that of the first electrode, and the other of the first and second refractive layers has a lower refractive index than that of the first electrode.

15. The OLED display device according to claim 10, further comprising a second insulating layer between the first and second organic layers.

16. The OLED display device according to claim 10, wherein the first and second organic layers each comprise at least one layer in common selected from the group consisting of an HIL, an HTL, an HBL, an ETL, and an EIL.

17. The OLED display device according to claim 16, wherein the at least one layer in common in the first and second organic layers has a different thickness in the first organic layer than in the second organic layer.

18. The OLED display device according to claim 10, wherein the first electrode is formed of a material selected from the group consisting of indium tin oxide (ITO), indium zinc oxide (IZO), and a transparent polymer, and the second electrode is formed of a material selected from the group consisting of Al, an Al alloy, Ag, Mg-Ag, Ca-Ag, and a combination thereof.

19. The OLED display device according to claim 10, wherein the first electrode is formed of a material selected from the group consisting of Al, an Al alloy, Ag, Mg-Ag, Ca-Ag, and a combination thereof, and the second electrode is formed of a material selected from the group consisting of ITO, IZO, and a transparent polymer.

20. An organic light emitting diode (OLED) display device comprising:
    a substrate;
    a first electrode on the substrate and extending in a first direction;
    a first organic layer on the first electrode and having a first emission layer (EML) for displaying a first color;
    a second organic layer on the same first electrode and having a second EML for displaying a second color that is complementary to the first color; and
    a second electrode on the first and second organic layers and extending in a second direction crossing the first direction,
    wherein the first organic layer has a different thickness from the second organic layer,
    wherein the first organic layer and the second organic layer are separated from each other along the first direction, and wherein a side of the first organic layer opposing a side of the first electrode is on a same plane as a side of the second organic layer opposing the side of the first electrode.

* * * * *

UNITED STATES PATENT AND TRADEMARK OFFICE
CERTIFICATE OF CORRECTION

PATENT NO. : 8,040,055 B2
APPLICATION NO. : 12/427607
DATED : October 18, 2011
INVENTOR(S) : Young-Mo Koo et al.

It is certified that error appears in the above-identified patent and that said Letters Patent is hereby corrected as shown below:

On the Title Page

Item (54) and in the Specification,
Column 1, line 3, Title.    Delete "THICKNESS"
                            Insert -- THICKNESSES --

Item (75) Inventors, line 1.    Delete "Oh-Keun"
                                Insert -- Ok-Keun --

Item (75) Inventors, line 3.    Delete "Yonging (KR)"
                                Insert -- Yongin (KR) --

Item (57) Abstract, line 13.    After "may"
                                Insert -- be --

Item (56) References Cited, page 2, right    Delete "al., High-brightness"
column, Other Publications, line 7.          Insert -- al., "High-brightness --

Item (56) References Cited, page 2, right    Delete "cathode,"
column, Other Publications, line 8.          Insert -- cathode", --

Signed and Sealed this
Twenty-sixth Day of November, 2013

Margaret A. Focarino
*Commissioner for Patents of the United States Patent and Trademark Office*